United States Patent [19]

Kleinschmidt et al.

[11] Patent Number: 4,861,648

[45] Date of Patent: * Aug. 29, 1989

[54] MATERIALS FOR LAMINATING FLEXIBLE PRINTED CIRCUITS

[75] Inventors: Eric W. Kleinschmidt, Mesa; Thomas M. Kloss, Jr., Tempe; William R. Bell, Chandler, all of Ariz.

[73] Assignee: Gila River Products, Inc., Chandler, Ariz.

[*] Notice: The portion of the term of this patent subsequent to Sep. 1, 2004 has been disclaimed.

[21] Appl. No.: 167,390

[22] Filed: Mar. 14, 1988

[51] Int. Cl.$^4$ .............................................. B32B 9/00
[52] U.S. Cl. ..................................... 428/40; 428/216; 428/352; 428/423.7; 428/901; 428/910; 428/209; 428/421; 428/422; 428/457; 428/458; 428/412; 428/480; 428/457; 428/458; 428/412; 428/480; 428/425.8; 428/447; 428/522; 428/411.1; 428/523
[58] Field of Search ................. 428/40, 209, 216, 352, 428/423.7, 901, 910, 421, 422, 457, 458, 412, 480, 425.8, 447, 522, 411.1, 523

[56] References Cited

U.S. PATENT DOCUMENTS

| | | | |
|---|---|---|---|
| 1,851,177 | 3/1932 | Harvey et al. | 428/211 |
| 3,086,071 | 4/1963 | Preston | 174/117 |
| 3,136,680 | 6/1964 | Hochberg | 161/189 |
| 3,215,574 | 11/1965 | Korb | 156/3 |
| 3,238,078 | 3/1966 | Baldwin | 156/87 |
| 3,303,081 | 2/1967 | Michaelson et al. | 156/219 |
| 3,433,888 | 3/1969 | Tally et al. | 174/68.5 |
| 3,649,475 | 3/1972 | Degnan et al. | 204/15 |
| 3,700,537 | 10/1972 | Scher | 161/89 |
| 3,701,706 | 10/1972 | Giddings et al. | 156/306 |
| 3,723,220 | 3/1973 | Scher et al. | 156/219 |
| 3,761,338 | 9/1973 | Ungar et al. | 156/219 |
| 3,929,545 | 12/1975 | Van Dyck et al. | 156/220 |
| 3,932,250 | 1/1976 | Sato et al. | 156/213 |
| 3,940,534 | 2/1976 | Fick et al. | 428/228 |
| 3,953,924 | 5/1976 | Zachry et al. | 29/625 |
| 3,960,627 | 6/1976 | Halberschmidt et al. | 156/104 |
| 3,980,016 | 9/1976 | Taylor | 100/295 |
| 4,012,307 | 3/1977 | Phillips | 204/192 E |
| 4,064,357 | 12/1977 | Dixon et al. | 174/68.5 |
| 4,064,552 | 12/1977 | Angelucci et al. | 361/414 |
| 4,075,386 | 2/1978 | Willorf | 428/216 |
| 4,188,714 | 2/1980 | Jean | 29/628 |
| 4,211,603 | 7/1980 | Reed | 156/659.1 |
| 4,224,378 | 9/1980 | Schroeter et al. | 428/412 |
| 4,249,977 | 2/1981 | Bartholomew | 156/288 |
| 4,264,404 | 4/1981 | Giesler | 156/537 |
| 4,268,339 | 5/1981 | Urban | 156/272 |
| 4,282,120 | 8/1981 | Cisterni | 260/17.4 |
| 4,340,439 | 7/1982 | Giesler | 156/323 |
| 4,350,551 | 9/1982 | Michaelson | 156/245 |
| 4,461,800 | 7/1984 | Tanaka | 428/217 |
| 4,680,220 | 7/1987 | Johnson | 428/241 |
| 4,687,695 | 8/1987 | Hornsby | 428/192 |
| 4,690,845 | 9/1987 | Kloss, Jr. | 428/40 |
| 4,698,729 | 10/1987 | Riesner et al. | 361/386 |

FOREIGN PATENT DOCUMENTS 2164823  2/1973  France.
2230497  2/1974  France.

OTHER PUBLICATIONS

Du Pont DuPont Tedlar PVF Film Bulletin TD-1A Revised 8/74.

(List continued on next page.)

*Primary Examiner*—Ellis P. Robinson
*Assistant Examiner*—P. J. Ryan
*Attorney, Agent, or Firm*—Cates & Phillips

[57] ABSTRACT

The invention provides a stratiform press sheet useful in laminating three-dimensional flexible printed circuits on a flat bed press, the sheet having a median conformable layer comprising a polymeric thermoplastic film; a polymeric release layer; a stabilizing layer made of a sheet of metal foil; and adhesive means to bond the above components in a single, stratiform sheet. The metal foil is functional at both the conventional lower laminating temperatures and the higher temperatures approaching 600 degrees F., and accordingly by careful selection of the other components it is possible to provide unified stratiform press pad sheets accommodating a wide range of laminating temperatures.

15 Claims, 1 Drawing Sheet

OTHER PUBLICATIONS

Du Pont Bulletin TD-2 Revised 4/82.
Du Pont Bulletin TD-3 Revised 6/68.
Du Pont Bulletin TD-4A.
Du Pont Bulletin TD-5, Revised 11/70.
Du Pont Bulletin TD-6, Revised 2/74.
Du Pont Bulletin TD-14, Revised 11/75.
Du Pont Bulletin TD-33.
Du Pont Bulletin TD-34, Revised 11/75.
Du Pont Bulletin TD-35, Issued 8/79.
Du Pont Price List, Eff. 7/1/81.
Lustro Plastics Co. Lustro A150 Co., Polyester Plastic Sheeting-Rolls Price List, 4/6/81.
Eastman Plastics Materials Bulletin-BB-580, Kodar A150 Polyester, Mar. 1978.
Polymer Industries Technical Information, Bulletin Lamal HSA.
American Hoechst Hostaphan Polyester Film Corporation, 5000 Series (Technical Bulletion ), 10/79.
Telidyne Inc., Telidyne Report, Third Quarter, 1982.

MATERIALS FOR LAMINATING FLEXIBLE PRINTED CIRCUITS

BACKGROUND OF THE INVENTION

This invention relates to improvements in materials for laminating printed circuits at low pressures on flat bed presses.

In the manufacture of flexible and flat cable circuits, layers of high dielectric strength plastic films with low shrinkage and good stability at high temperatures are first combined with copper or other conductive metal by an additive or subtractive process and electrical circuits are produced by etching or deposition of these metals on the plastic surface. These circuits are then covered by a layer of similar adhesive coated plastic dielectric film to protect and insulate the finished circuit Holes may be punched or drilled in the layers to allow for connections to the finished circuit.

The circuit assembly is then laid up with a protective cap in single or multiple layers (up to 20 plus) and then laminated under heat and pressure, taking extreme care to register the circuits and drilled holes. This process is normally performed in a flat bed laminating press by the operator of the press, using pad materials consisting of multiple layers piled on between the steel caul plates and the finished circuit Typically, the first layer, next to the steel plate, is a non-sticking release material such as a tetrafluoroethylene coated fiberglass cloth. The second layer includes multiple plies of kraft paper or equivalent cellulosic wood product; the third layer consists of one or more plies of a thermoplastic film; and the final layer consists of one or more layers of release materials such as tetrafluoroethylene or polyvinyl fluoride The resultant lamelliform pad may include 10 or more loosely piled layers of dissimilar materials, each having two sides presenting up to 20 opportunities for possible contamination. Because each layer is customarily hand-cut and laid up by hand, there is a high margin for error in the sequencing of dissimilar materials, resulting in defective circuits.

The pads are arranged in a prescribed order on either side of the circuit assembly with the release layer facing the assembly. Multiple circuit assemblies with associated pads are placed in the press to form a book, and the entire book is pressed in one operation to laminate the individual circuit assemblies. When the laminating process is complete the pads are stripped away and the laminated circuit assemblies are removed for further handling.

Among the problems found in the prior art process were erratic results and lamination failures due to errors in selecting and laying up the multiple plies of dissimilar materials, hot spots appearing in the laminate creases, pockets of gas and other contamination trapped in the pad, lateral shifting of the pad materials and the circuit laminate, and moisture absorption by the cellulosic pad.

U.S. Pat. No. 4,690,845, issued Sept. 1, 1987 to Thomas M. Kloss, Jr., discloses an invention which alleviates the foregoing problems by providing a unified stratiform press pad sheet which is used in place of the loosely assembled multi-layer pads of the prior art. The Kloss press pad sheet is used primarily in applications in which the circuit assembly is laminated at temperatures in the range from 180 to 400 degrees F.

More recently research efforts have been directed toward applications in which the circuit assembly is laminated with new dielectric materials which provide improved rigid and flexible circuit boards but which require higher lamination temperatures. This in turn has created a need for a unified press pad which is functional at the higher lamination temperatures. The new requirement involves temperatures as high as 560 to 600 degrees F.

Accordingly, it is an object of the present invention to provide a unified stratiform press pad sheet which offers the advantages provided by the Kloss press pad but which is functional both at the conventional lamination temperatures and at the higher temperatures required to accommodate the newer dielectic laminating materials.

DEFINITIONS

As used in this specification, "laminating temperature peak" means the highest temperature attained in the book while in the laminating cycle under consideration; "manufacturing cycle time" means the time from beginning the job of laying up the book for the press through the press cycle time; "press cycle time" means the time elapsed from starting the pressing operation on the book until the time the book is removed from the press to make room for a new book; "melting point" means the transition from solid including glass to liquid; "glass transition point" means the transition between crystalline to plastic (but not liquid) forms

SUMMARY OF THE INVENTION

Briefly there is provided to achieve the foregoing objects a unified stratiform sheet useful in a flat press method of laminating printed circuits. The sheet has a median layer comprising a polymeric thermoplastic film having a glass transition point lower than the laminating temperature peak, a melting point higher than the laminating temperature peak, and a thickness at the laminating temperature peak at least as great as the differences between the minimum and maximum thicknesses in the cross-section of the three-dimensional flexible printed circuit. The sheet also has a polymeric release layer, having a thickness of from 0.1 to 4 mils; a stabilizing layer comprising a sheet of metal foil; and adhesive means to bond the component layers in a single, stratiform press sheet. The metal foil component is functional at both the conventional lower laminating temperatures and the higher temperatures approaching 600 degrees F., and accordingly by selecting appropriate thermoplastic films, release films, and adhesive bonding means, it is possible to provide unified stratiform press pad sheets accommodating a wide range of laminating temperatures.

The stratiform sheet is utilized in the method of laminating printed circuits in a flat press by providing a work piece comprising one or more circuit assemblies in need of lamination, providing the stratiform sheets herein specified, and arranging each circuit assembly in a book with one of said stratiform sheets on each side of a circuit assembly with the release layers thereof facing the circuit assemblies in the press, then pressing the book for the press cycle time appropriate to the product and thickness of the book. The method is particularly useful at press pressures of about 250 to 400 p.s.i. and, by selection of the designated median, release and bonding components, at various temperatures within the range from 180 to 600 degrees F.

BRIEF DESCRIPTION OF THE DRAWINGS

The objects, features and advantages of the invention will be apparent to those skilled in the art from the following detailed description, taken together with the accompanying drawings, in which.

DESCRIPTION OF THE PREFERRED EMBODIMENT

Figure 1:
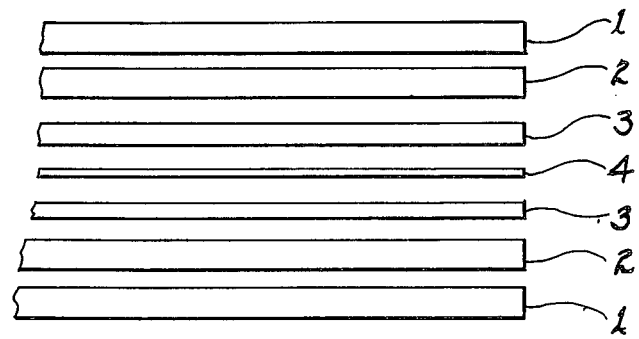
FIG. 1 is a schematic representation of the arrangement of a book for a flat press, including a single flexible circuit assembly and the stratiform sheet means according to this invention.

FIG. 1 illustrates the use of the stratiform sheet means of the present invention, arranged with a flexible circuit assembly in a book for a flat bed press. Between the press platens there is disposed, in the following order, from top to bottom, a steel-press plate 1, teflon glass cloth 2, and the stratiform press sheet 3 of the present invention. Then the flexible printed circuit assembly 4 is inserted and a mirror image (i.e., reverse order) of the arrangement is repeated on the other side of the circuit assembly. The component parts of the flexible printed circuit product, per se, are not shown, it being understood that any suitable flexible, printed circuit assembly to be laminated may become the work piece under consideration.

Multiple stacks of the arrangement between the glass cloth elements 2 may be made to create a book, separated by steel plates, and the multiple assemblies may be laminated in one pressing.

Figure 2:
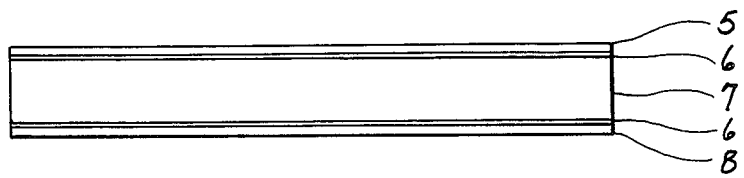
FIG. 2 is a stratiform sheet made according to the teachings of this invention.

Turning now to FIG. 2, in which an enlarged representation of the pad 3 is shown, layer 5 is a polymeric release layer which is designed to face the printed circuit assembly and which facilitates release of the press pad 3 from the printed circuit after the lamination procedure has been completed. Polyvinylfluoride, which can be obtained from DuPont Chemical Company under the trademark TEDLAR 50AM20LH, is useful as a release layer in the lamination temperature range of 180 to 360 degrees F. Various forms of TEFLON resin manufactured by DuPont Chemical Company may be made into films which are also useful as release materials in the present invention. Polytetrafluoroethylene (PTFE) is a version of TEFLON which is purchased as a resin from DuPont and made into a film by various companies, either by skiving a molded billet or by casting from an emulsion. Cast PTFE film is preferred in the present invention because of its improved conformability. It may be obtained from Chemical Fabrics Corporation and is particularly useful for laminating temperatures in the range from about 290 to 600 degrees F. Fluorinated ethylene polypropylene (FEP) and perfluoroalkoxy polymer (PFA) are other TEFLON versions which may be obtained in film form from DuPont for use in the present invention. FEP is functional in the present invention at lamination temperatures of about 180 to 475 degrees F., and PFA is operable at temperatures as high as 600 degrees F.

Polysiloxane (silicone) and other release materials with similar properties may also be used. The thickness of Layer 5 may vary from 0.1 mil to 4 mils. At more than 4 mils difficulty in conforming to three dimensional products may be experienced.

Layer 6 is a high performance, high temperature adhesive. A presently preferred adhesive may be obtained from Morton Chemical Company under the name LAMAL HSA. It is a two-part urethane, prepolymeric adhesive having a solids content of about 70%, dissolved in isopropanol.

Layer 7 is a polymeric thermoplastic film which is plastic but not melted, and has good conformability at operating temperatures. A useful thermoplastic is a modified polyester in a thickness of 7.5 or 10 mils, which is a copolyester formed from teraphthalic acid and isophthalic acid with cyclohexanedimethanol, and which has a glass transition point about 189 degrees F. It is manufactured by Eastman Chemical Co. in resin form and may be obtained in film form for use in the present invention from Lustro Plastics Co., Saugus, Calif., under the designation "A150". It is functional at laminating temperatures in the range from about 180 to 510 degrees F. Another thermoplastic material which can be used is polycyclohexanemethanolterephthalate, sold by Eastman Chemical Co. under the designation "PCT 3874". It has a glass transition temperature of about 230 degrees F. and is functional in the laminating temperature range from about 200 to 560 degrees F. A further material to be used as Layer 7 is polyaryletheretherketone (PEEK), sold by ICI Chemical Company in amorphous film form under the designation "Stabar K". It has a glass transition temperature of about 290 degrees F. and is functional at temperatures in the range of about 290 to 600 degrees F. It is preferred that the polymeric thermoplastic film of Layer 7 have a glass transition temperature above 170 degrees F. and preferably in the range from 170 degrees F. to 300 degrees F.

Another layer of adhesive 6 is applied to bond the thermoplastic layer 7 and the outer stabilizing layer 8.

Layer 8 is a stabilizing layer comprising a sheet of metal foil which is formed as an integral part of the unified press sheet in order to prevent lateral movement of the thermoplastic film 7. Any material which can be formed into a foil sheet having a thickness within the range from 0.25 to 5 mils may be used in the invention. A material which is particularly useful as the stabilizing layer is an aluminum alloy foil, having a thickness of 0.7 mil, obtainable from Reynolds Aluminum Co. under the designation "Alloy 1145-0". Other metal or metal alloy sheets such as copper, tin, stainless steel, and the like may be used in the invention.

The function of the thermoplastic layer 7 is to transmit pressure uniformly from the smooth platen to the three dimensional laminate under the conditions of temperature and pressure used to consolidate the laminate. It is necessary that all parts of the encapsulated printed circuit be in intimate contact with the thermosetting plastic (dielectric) which encapsulates it, and that there be no voids or unbonded areas between the circuit and the dielectric plastic.

A facet of the problem is that if the thermoplastic forming polymer melts and flows freely it may encapsulate and seal the entire book of laminates. According to the present invention, the material selected for layer 7 will have a melting point which avoids the liquid at the laminating temperature peak encountered during the press cycle. Thus, the material of layer 17 should have a melting point higher than the laminating temperature peak, or in the event it has a broad melting point, its melting characteristics should be such that it maintains a thickness at the laminating temperature peak at least as great as the differences between the minimum and maximum thicknesses in the cross-section of the three-dimensional flexible printed circuit.

If the melt reduces the thermoplastic layer 7 to a thickness that is thinner than the differences between the peaks and valleys in the cross-section of the flexible printed circuit, the thermoplastic layer loses its ability to conform to the profile of the circuit, and thereby fails in its function of evenly distributing heat and pressure.

The use of a sheet of metal foil as the stabilizing layer 8 has provided a particularly useful solution to the need for a press pad which is functional at the higher lamination temperatures required for use of the new dielectric materials referred to earlier in this specification. The present invention is based in part on the discovery that the metal foil is operable not only at the higher temperatures required in the recent research efforts, but also at the temperatures encountered in current commercial operations. Thus, the metal foil serves as a universal component meeting all known temperature needs.

The stratiform sheet material of this invention is manufactured on a continuous web laminating system wherein a suitable adhesive is applied to a roll of the thermoplastic material. It is then passed through an oven to remove the solvent and a release layer is applied to the adhesive layer using a heated nip and the resulting laminate is reversed and suitable adhesive is applied to the other side of the thermoplastic layer. It goes through the oven to remove the solvent, and the metal foil stabilizing layer is applied to the second adhesive treated side using a heated laminating nip and the continuous sheeting is collected on another roll. From there it may be cut to specifically desired sizes suitable for immediate insertion into a book for use in a press, or it may shipped in roll form to a remote location for processing in that manner.

Optionally, the means of manufacture might be a one pass coating operation, and be done with a variety of coating methods such as, for example, Meyer rod, air knife or reverse roll coating offset gravure.

The stratiform sheet of this invention replaces multiple layers of dissimilar materials used in the flat bed press method of forming flexible printed circuits under low pressure and heat. Whereas, formerly, the press operator was obliged to cut and lay up as many as 20 different layers of paper and plastic materials, it will be seen that in the practice of this invention a single stratiform sheet placed on each side of the circuit assembly will suffice.

In the practice of this invention, which is particularly useful in laminating flexible printed circuits in a flat bed press, one or more circuit assemblies are provided as a work piece, a single stratiform sheet is arranged on each side of a circuit assembly with the release layer of each sheet facing a circuit assembly in the press. The book of as many circuit assemblies as desired is arranged in the press between teflon glass cloth layers and steel press plates at each end and between each repetition of circuit assembly and associated stratiform sheets. The book is then pressed at temperatures ranging from room temperature up to about 600 degrees F. and at pressures between 250-400 p.s.i.

Some of the advantages enjoyed by the use of the stratiform sheet of the present invention are that the time consuming chores of cutting and sequencing the layers at the press are entirely eliminated, resulting in a shorter manufacturing cycle time. The human error encountered in cutting and putting the layers together is avoided, and consequently the chances or ruining an expensive work piece are almost entirely eliminated.

Among the other benefits obtained from use of the stratiform sheet of this invention there have been found an absence of creases, entrapped gases and other contaminants, shrinkage is minimized, and a more uniform distribution of heat and pressure is maintained throughout the laminating cycle wherein the thermoplastic layer goes through its glass transition stage and back, attributable, it is thought, to the quick initial conformance with pressure and continued conformance with flow in the thermoplastic layer. The use of kraft paper is avoided altogether and, fortuitously, materials have been provided in the preferred embodiment that will cover a broad range of pressing conditions and most of the pressing requirements encountered in the flexible printed circuit art.

The following examples describe specific embodiments which are illustrative of the invention:

EXAMPLE 1

To a roll of a co-polyester formed from terephthalic acid and isophthalic acid with cyclohexanedimethanol and whose glass transition point is 189 degrees F and whose sheet thickness is 10 mils (obtained from Lustro Plastics Co., Saugus, Calif., under its designation A150) there was applied a two-part urethane prepolymeric adhesive (obtained from Morton Chemical Company under the name LAMAL HSA) by means of a standard gravure coating head The coated co-polymer was sent through an oven to remove the solvents from the adhesive and a roll of Teflon release material (obtained from DuPont Chemical Company under the code "FEP") was laminated to the adhesive-treated side with a hot laminating nip and collected on a second roll. The thickness of the release layer was 1 mil.

The second roll was passed through the gravure apparatus again to apply the LAMAL adhesive to the opposite side of the A150 co-polymer. The coated sheet was again passed through the oven to remove the solvents and laminated to a roll of 0.7 mil aluminum foil (Alloy 1145-0) through a hot laminating nip. The resulting stratiform sheet was collected on a roll for storage, and at a subsequent time it was cut into sheets of suitable size.

A book for press lamination was made up of caul plate, glass cloth, a stratiform sheet as described above, flexible circuit assembly in need of lamination, stratiform sheet, glass cloth and caul plate, in that order, with the release layers of the stratiform sheets facing the circuit assembly. The stratiform sheet was provided with matte finish on the release layer side and smooth finish on the aluminum side.

The book was assembled at the press site and loaded into the flat bed laminating press. The press cycle was carried out for 80 minutes at 300 p.s.i. The laminating temperature peak was 360 degrees F. Upon completion, the work piece was removed from the press and found to be well formed and free of defects.

Books of the same components were tested at various other temperatures and found to be functional in the range from 180 to 475 degrees F.

EXAMPLE 2

Stratiform press sheets were prepared using the procedure set out in Example 1, but using 1.5 mil copper foil as the stabilizing layer, instead of the aluminum foil. The sheets were found to be functional within the range from 180 to 475 degrees F.

EXAMPLE 3

Stratiform press sheets were prepared using the procedure set out in Example 1, but using 1 mil tin foil as the stabilizing layer, instead of the aluminum foil. The sheets were found to be functional within the range from 180 to 475 degrees F.

EXAMPLE 4

Stratiform press pad sheets were prepared using the procedure set out in Example 1 but using as the release layer a roll of Teflon obtained from DuPont Chemical Company under the code PFA.

Books for press lamination were prepared using these press pad sheets and tested at various temperatures.

They were found to be functional within the range of 180 to 510 degrees F.

EXAMPLE 5

Stratiform press pad sheets were prepared using the procedure set out in Example 1. The components were 0.7 mil aluminum foil (Alloy 1145-0) as the stabilizing layer, 1 mil PFA (DuPont Teflon) as the release layer, and 10 mil polycyclohexanemethanolterephthalate (obtained from Eastman Chemical Company under the name PCT 3874) as the thermoplastic conformable layer.

Books for press lamination were prepared using these press pad sheets and tested at various temperatures.

They were found to be functional within the range of 200 to 560 degrees F.

EXAMPLE 6

Stratiform press pad sheets were prepared using the procedure set out in Example 1. The components were 0.7 mil aluminum foil (Alloy 1145-0) as the stabilizing layer, 1 mil polytetrafluoroethylene film (obtained from Chemical Fabrics Corporation under the name Chemfab DF-800) as the release layer, and 10 mil polyetheretherketone (PEEK), obtained from ICI Chemical Company under the name ICI Stabar K, as the thermoplastic conformable layer.

Books for press lamination were prepared using these press pad sheets and tested at various temperatures.

They were found to be functional within the range of 290 to 600 degrees F.

Although various preferred embodiments of the invention have been described in detail it will be understood by those skilled in the art that variations may be made without departing from the spirit of the invention.

What is claimed is:

1. A stratiform press sheet for use in laminating three dimensional flexible printed circuits on a flat bed press, said press sheet having its component layers bonded together to form a unified sheet containing:
    (a) a median layer comprising a polymeric thermoplastic film having a glass transition point lower than the laminating temperature peak and a thickness at the laminating temperature peak at least as great as the differences between the minimum and maximum thicknesses in the cross-section of the three-dimensional flexible printed circuit for uniform transmission of pressure in said laminating process;
    (b) a polymeric release layer having a thickness of from 0.1 to 4 mils and having an outer surface for releasable disposition against a printed circuit which is being laminated;
    (c) an outer stabilizing layer comprising a sheet of metal foil and being formed as an integral part of said unified press sheet in order to prevent lateral movement of said thermoplastic film when in a plastic state in said laminating process; and
    (d) adhesive means to bond the component layers in a single, stratiform press sheet, said press sheet being further characterized by substantial freedom from creases, entrapped gases, and contaminants between said layers.

2. The stratiform press sheet of claim 1 wherein said polymeric thermoplastic layer is selected from polyvinylchlorides, polyethylenes, polycarbonates, acrylics, polycyclohexanemethanolterephthalate, polyetheretherketone, ABS, polyester and co-polymers thereof and said polymeric release layer is selected from polyvinylfluorides, polytetrafluoroethylenes, and polysiloxanes.

3. The stratiform press sheet of claim 1 wherein said sheet of metal foil is aluminum.

4. The stratiform press sheet of claim 1 wherein said sheet of metal foil is copper.

5. The stratiform press sheet of claim 1 wherein said sheet of metal foil is stainless steel.

6. The stratiform press sheet of claim 1 wherein the polymeric release layer and the polymeric stabilizing layer are joined to the polymeric thermoplastic layer by means of polymeric adhesives.

7. The stratiform press sheet of claim 3 wherein said adhesive is a two-part urethane prepolymeric adhesive.

8. The stratiform press sheet of claim 1 with the addition of identifying indicia for distinguishing the release layer side from the stabilizing layer side to prevent inadvertent reversal in use.

9. The stratiform press sheet of claim 1 wherein the thickness of said median layer is within the range of about 4 mils to 15 mils.

10. The stratiform press sheet of claim 1 wherein the thickness of said stabilizing layer is within the range of about 0.25 mil to 5 mils.

11. A charge of material for a flat bed press useful in printed circuit lamination comprising a printed circuit assembly and a separate unified stratiform press sheet containing:
    (a) a polymeric release film layer having a thickness of 0.1 to 4 mils and having an outer surface for releasable disposition against a printed circuit to be laminated;
    (b) an inner layer comprising a thermoplastic polymeric film having a glass transition point lower than the laminating temperature peak and a melting point higher than the laminating temperature peak for uniform transmission of pressure in said printed circuit lamination;
    (c) an outer stabilizing layer comprising a sheet of metal foil and being formed as an integral part of said unified press sheet in order to prevent lateral movement of said thermoplastic film when in a plastic state in said laminating process; and
    (d) adhesive means to bind the component layers in a single, stratiform press sheet, said stratiform sheet being further characterized by substantial absence of creases, gases and contaminants between said layers.

12. The stratiform press sheet of claim 1 wherein the glass transition point of said thermoplastic polymer is from about 170 degrees F to about 300 degrees F.

13. The charge of material of claim 8 wherein the glass transition point of said thermoplastic polymer is from about 170 degrees F to about 300 degrees F.

14. A separate stratiform press sheet useful in assisting the process of heat forming laminated flexible printed circuits on a flat bed press at low pressure and at temperatures in the range from 180 degrees F. to 600 degrees F., comprising:
 (a) an outer stabilizing layer comprising a sheet of metal foil, in a thickness from about 0.25 to 5 mils;
 (b) a temperature responsive median layer of plastic film for uniform transmission of pressure in said process of heat forming flexible printed circuits selected from polyester copolymers, polycyclohexanemethanolterephthalate and polyetheretherketone, in thicknesses thereof from about 4 mils to 15 mils and having a glass transition point lower than the lamination temperature peak;
 (c) an inner release film selected from FEP, PFA and PTFE, in thicknesses from about 0.1 to 4 mils; and
 (d) means for bonding the components of said press sheet, selected from compatible polymeric adhesives.

15. The stratiform press sheet of claim 1 wherein said sheet of metal foil is tin.

* * * * *